United States Patent [19]

Umeki

[11] Patent Number: 5,204,842
[45] Date of Patent: Apr. 20, 1993

[54] SEMICONDUCTOR MEMORY WITH MEMORY UNIT COMPRISING A PLURALITY OF MEMORY BLOCKS

[75] Inventor: Tsunenori Umeki, Hyogo, Japan

[73] Assignee: Mitsubishi Denki Kabushiki Kaisha, Tokyo, Japan

[21] Appl. No.: 563,875

[22] Filed: Aug. 7, 1990

Related U.S. Application Data

[63] Continuation of Ser. No. 228,585, Aug. 5, 1988, abandoned.

[30] Foreign Application Priority Data

Aug. 5, 1987 [JP] Japan .................. 62-196817
Aug. 5, 1987 [JP] Japan .................. 62-196818

[51] Int. Cl.$^5$ .............................. G11C 8/00
[52] U.S. Cl. ................... 365/230.03; 360/51
[58] Field of Search .......... 365/230.03, 63, 72; 360/51

[56] References Cited

U.S. PATENT DOCUMENTS

| | | | |
|---|---|---|---|
| 4,638,458 | 1/1987 | Itoh | 365/51 |
| 4,675,845 | 6/1987 | Itoh et al. | 365/230.03 X |
| 4,709,351 | 11/1987 | Kajigaya | 365/51 |
| 4,782,465 | 11/1988 | Uchida | 365/72 |

FOREIGN PATENT DOCUMENTS 0213835 3/1987 European Pat. Off. .......... 365/63

OTHER PUBLICATIONS

IBM Technical Disclosure Bulletin vol. 18 No. 10 Mar. 1976 Array Row Driver NPN Transistor, Battista et al.
Electronics (Jun. 2, 1982) Asynchronous Circuits Accelerate Access to 256-K Read-Only Memory, Scherpenberg et al.
IBM Technical Disclosure Bulletin vol. 17 No. 1 Jun. 1974 Memory System Fabrication Using Laser Formed Connections, Cook et al.
Kouyama, S. et al.: Very High Speed MOS Device, Japan, Feb. 10, 1986, pp. 316-318.

Primary Examiner—Andrew L. Sniezek
Attorney, Agent, or Firm—Lowe, Price, LeBlanc & Becker

[57] ABSTRACT

An AND type read-only memory (D-A-ROM), includes a memory unit divided into blocks in a row direction and into sub-blocks a column direction, a Y decoder, an X decoder and a column selector. An output of the Y decoder and an output of the X decoder are connected to the memory blocks by first and second gate electrode connectors, respectively. A read control signal from the CPU is connected to each of the memory blocks by third gate electrode connectors. In addition, the output of the X decoder is supplied in parallel to each of the memory sub-blocks through bypass connectors including aluminum interconnections of a separately formed second layer. The read control signal is supplied in parallel to each of the memory sub-blocks through bypass interconnections of the second layer.

11 Claims, 4 Drawing Sheets

SEMICONDUCTOR MEMORY WITH MEMORY UNIT COMPRISING A PLURALITY OF MEMORY BLOCKS

This application is a continuation of application Ser. No. 07/228,585 filed Aug. 5, 1988 now abandoned.

BACKGROUND OF THE INVENTION

1. Field of the Invention

The present invention relates generally to semiconductor memories, and more particularly, to a semiconductor memory comprising a memory unit comprising a plurality of memory blocks, and a bypass metal interconnection layer for propagation of various signals for reading out data to each of the memory blocks.

2. Description of the Prior Art

Conventionally, as one example of a semiconductor memory, an AND type semiconductor memory which is integrated in a semiconductor chip has been known. More specifically, an AND type read-only memory (referred to as D-A-ROM hereinafter) employing a depletion type transistor has been actually used. Such a type of semiconductor memory is disclosed in detail, for example, by S. Kouyama et al. in "Very High Speed MOS Device", Baifukan, the Japanese publication issued on Feb. 10, 1986.

Figure 1:
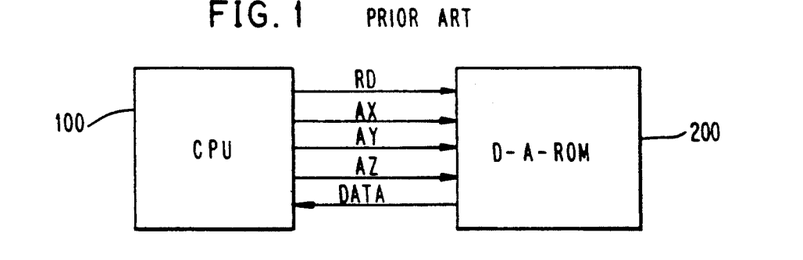
FIG. 1 is a schematic block diagram showing a main portion of a microcomputer employing a conventional D-A-ROM.

FIG. 1 is a block diagram showing schematically the environment in which such a conventional D-A-ROM is used. More specifically, in FIG. 1, a CPU 100 in a microcomputer applies to a D-A-ROM 200 a read control signal RD and three kinds of address information $A_X$, $A_Y$ and $A_Z$ at predetermined timing at the time of reading out data. The D-A-ROM 200 is responsive to the signals for applying to the CPU 100 data read out from a contained memory unit (not shown).

Figure 2:
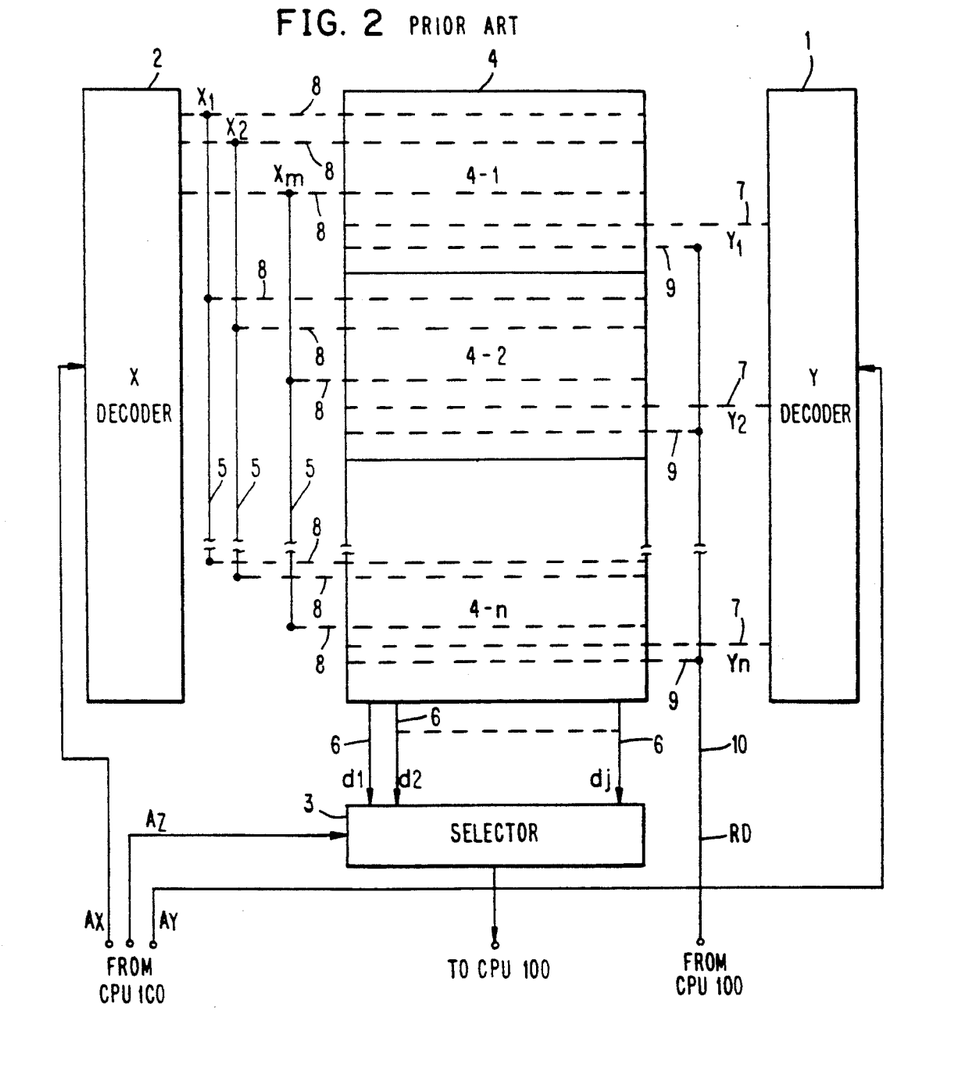
FIG. 2 is a block diagram showing a conventional D-A-ROM.

FIG. 2 is a block diagram showing structure of the above described D-A-ROM 200. More specifically, FIG. 2 shows the layout of the D-A-ROM employed in an 8-bit microcomputer "M50740-XXXP" manufactured by Mitsubishi Electric Corporation.

Referring now to FIG. 2, the conventional D-A-ROM will be described. In FIG. 2, the three kinds of address information $A_X$, $A_Y$ and $A_Z$ sent from the CPU 100 are applied to a block address decoder (X decoder) 2, a block decoder (Y decoder) 1 and a column selector 3, respectively. In addition, a memory unit 4, which comprises n memory block 4-1, 4-2, ..., 4-n defines J-bit data in response to designation by the X decoder 2 and the Y decoder 1.

More specifically, the Y decoder 1 is responsive to the address information $A_Y$ from the CPU 100 for generating signals $Y_1, Y_2, \ldots, Y_n$ for selecting a particular memory block to read out data out of one of the n memory blocks 4-1, 4-2, ..., 4-n. The Y decoder outputs the signals $Y_1, Y_2, \ldots, Y_n$, to output the same to first gate electrode connectors 7. The signals $Y_1, Y_2, \ldots, Y_n$ which are propagated through respective first gate electrode connectors layers 7 are applied to the corresponding memory blocks 4-1, 4-2, ..., 4-n, respectively, to be applied in common to particular gates (not shown) of a plurality of AND type memories each constituting each of the memory blocks.

In addition, the X decoder 2 is responsive to the address information $A_X$ from the CPU 100 for generating signals $X_1, X_2, \ldots, X_m$ for designating in common a particular row address in each of the memory blocks. The X decoder outputs the signals $X_1, X_2, \ldots, X_n$ to second gate electrode connectors 8. The signals $X_1, X_2, \ldots, X_m$ are further applied to the second gate electrode connectors 8 of other blocks through connectors 5 in a metal interconnection layer (aluminum interconnection layer). The signals $X_1, X_2, \ldots, X_m$ which are propagated through respective second gate electrode connectors 8 are applied in common to predetermined gates (not shown) in each of the memory blocks, so that a particular row address is designated in common in each of the memory blocks.

Furthermore, a read control signal RD is applied to third gate electrode connectors 9 from the CPU 100 through a connector 10 in the metal interconnection layer (aluminum interconnection layer). The first, second and third gate electrode connectors 7, 8 and 9 may all be formed in a single gate interconnector layer. The signal RD which is propagated through each of the third gate electrode connectors layers 9 is applied to predetermined gates (not shown) in each of the memory blocks.

More specifically, J-bit data $d_1, d_2, \ldots, d_j$ corresponding to a particular row address designated in response to the signals $X_1, X_2, \ldots, X_m$ from the X decoder 2 in a particular memory block selected in response to the signals $Y_1, Y_2, \ldots, Y_n$ from the Y decoder 1 are outputted to metal connectors (in the aluminum interconnection layer) each serving as a bit line in response to the read control signal RD applied from the CPU 100.

The column selector 3 is responsive to the address information $A_Z$ from the CPU 100 for reading out data corresponding to a particular column address, to send the same to the CPU 100.

Meanwhile, in the above described conventional D-A-ROM, if the number J of columns which can be read out at a time is increased, interconnection resistance values of the second gate electrode connectors 8 and the third gate electrode connectors 9 are increased, so that additional time is required for reading out data. Thus, in order to drive such gate electrode connectors each having high resistance thereby to surely read out J-bit data from each row, a decoder requires high driving ability. However, such high driving ability causes the power consumption to be substantially increased.

SUMMARY OF THE INVENTION

Therefore, an object of the present invention is to provide a semiconductor memory in which the data reading speed is increased.

Another object of the present invention is to provide a semiconductor memory in which the increase in power consumption required for reading out data is prevented.

Briefly stated, the present invention is directed to a semiconductor memory comprising a memory unit divided into a plurality of memory blocks and gate electrode connectors through which a row address signal and a read control signal are supplied to each of the memory blocks, which further separately comprises bypass metal connectors of a second layer through which the row address signal and the read control signal are supplied in parallel to sub-blocks of each of the memory blocks.

In accordance with another aspect of the present invention, in the semiconductor memory comprising a memory unit divided into a plurality of memory blocks and gate electrode connectors through which a row address signal and a read control signal are supplied to each of the memory blocks, there is separately provided bypass metal connectors of a first layer through which the row address signal and the read control signal are supplied in parallel to each of the memory blocks.

A principal advantage of the present invention is that the bypass metal connectors each having a small resistance value are provided so that interconnection resistance of a signal line through which the row address signal and the read control signal are propagated to each of the memory blocks is substantially lowered, whereby the data reading speed can be significantly improved.

Another advantage of the present invention is that the interconnection resistance of the signal line through which the row address signal and the read control signal are propagated to each of the memory blocks is lowered, whereby the power consumption can be significantly lowered at the time of reading out data.

Still another advantage of the present invention is that the metal connectors of the second layer are used as bypass connectors, whereby data reading can be speeded up without decreasing the integration degree of the semiconductor memory.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
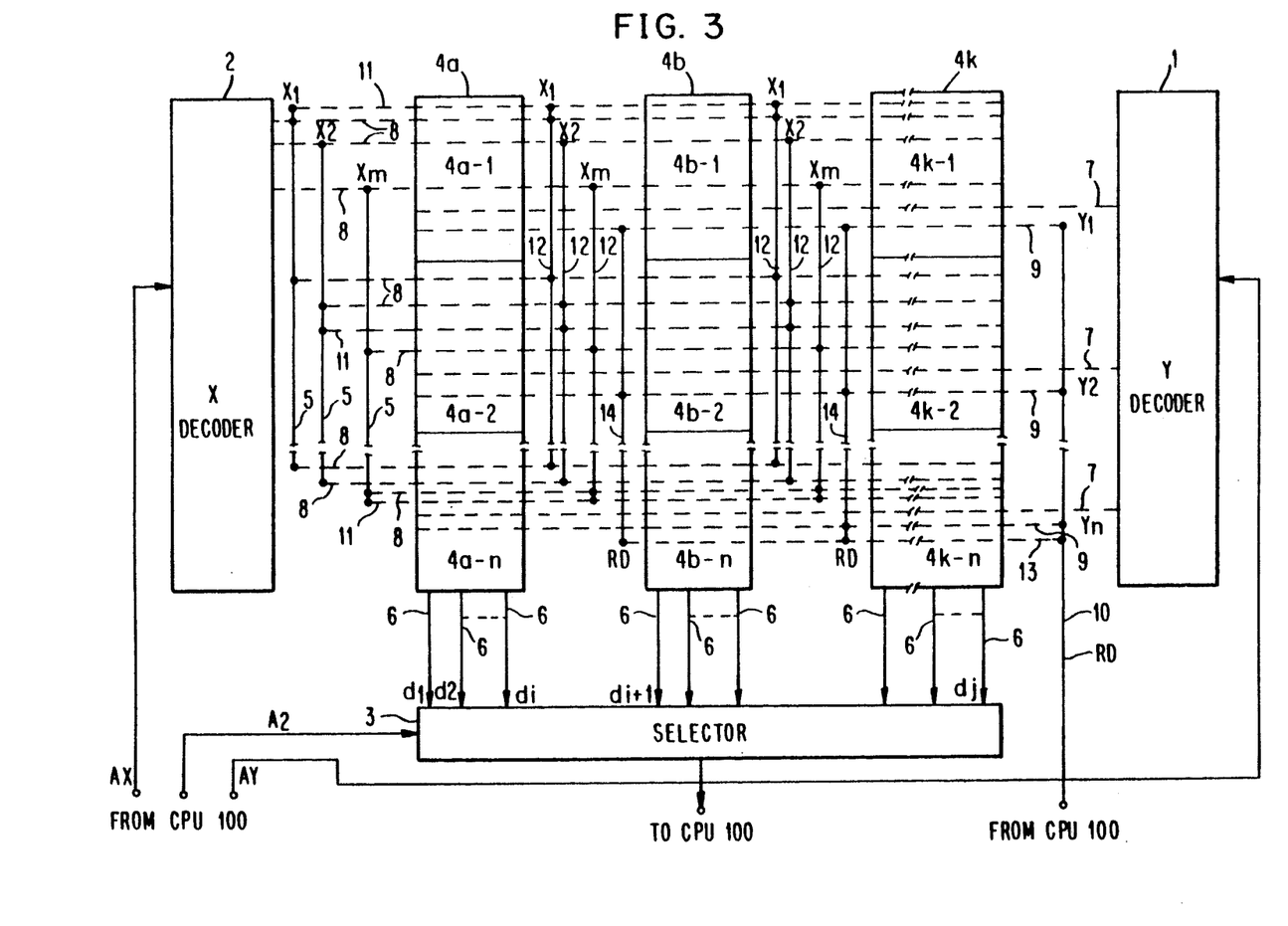
FIG. 3 is a block diagram showing a D-A-ROM according to an embodiment of the present invention.

FIG. 3 is a block diagram showing a D-A-ROM according to an embodiment of the present invention. The D-A-ROM shown in FIG. 3 is the same as the conventional D-A-ROM shown in FIG. 2 except for the following. More specifically, the memory unit 4 in the conventional example shown in FIG. 2 is divided into sub-blocks 4a to 4k. The sub-blocks are arranged in a column direction. That is, groups of columns of the memory blocks 4 - 1, 4 - 2, . . . , 4 - n are identified as a plurality of subblocks $4a \sim 1 - 4k - 1$, $4a - 2 \sim 4k - 2$, . . , $4a - n \sim 4k - n$, as shown in FIG. 3. As seen in both FIGS. 2 and 3, the memory blocks 4 - 1, 4 - 2, . . . , 4 - n are themselves each composed of a number of rows which are connected in series in the row direction.

In FIG. 3, the signals $Y_1, Y_2, \ldots, Y_n$ from Y decoder 1 are applied to respective memory blocks through first gate electrode connectors 7, as in the conventional example shown in FIG. 2. In addition, the signals $X_1, X_2, \ldots, X_m$ from X decoder 2 are applied to each of the memory blocks through metal connectors, i.e., through aluminum interconnections 5 of a first layer, and through the second gate electrode connectors 8, as in the conventional example shown in FIG. 2. Furthermore, the read control signal RD from CPU 100 is also applied to each of the memory blocks through a metal connector, i.e., an aluminum interconnection 10 of the first layer and third gate electrode connectors 9, as in the conventional example shown in FIG. 2. J-bit data $d_1, d_2, \ldots, d_j$ are outputted through metal connectors, i.e., aluminum interconnections 6 of the first layer from the memory blocks 4a to 4k (as divided in the column direction), to be applied to column selector 3.

However, the embodiment shown in FIG. 3 differs from the conventional example shown in FIG. 2 in that additional metal connectors i.e., aluminum interconnections 11, 12, 13 and 14 of a second layer are newly provided. More specifically, the aluminum interconnections 11 of the second layer extend over and in parallel with the second gate electrode connectors 8 from each of the aluminum interconnections 5 of the first layer. In a space between the memory blocks divided in the column direction, each of the aluminum interconnections 11 of the second layer is coupled by the aluminum interconnections 12 of the second layer to interconnection layers through which the same signal as that which is propagated through the above described aluminum interconnection 11 is propagated out of the second gate electrode connectors 8 extending in parallel. More specifically, the aluminum interconnections 11 and 12 of the second layer constitute a first bypass metal interconnection layer.

Additionally, one aluminum interconnection 13 of the second layer extends over and in parallel with the gate electrode interconnection layers 9 from the aluminum interconnection 10 of the first layer. In a space between the memory blocks divided in the column direction, the aluminum interconnection 13 of the second layer is coupled to the third gate electrode connectors 9 extending in parallel by the aluminum interconnections 14 of the second layer. More specifically, the aluminum interconnections 13 and 14 of the second layer constitute a second bypass metal interconnection layer.

A third bypass metal interconnection layer may be provided which, similarly to operation of the first bypass metal interconnection layer, applies the address information $A_y$ (i.e., signals $Y_1, Y_2, \ldots, Y_n$) from Y decoder 1 in parallel to each of the memory subblocks.

It will thus be appreciated that the structure of the D-A-ROM shown in FIG. 3 is basically the same as that of the D-A-ROM shown in FIG. 2, and the operations thereof are basically the same. However, the D-A-ROM in the embodiment shown in FIG. 3 is adapted such that the memory unit 4 is further divided into a plurality of blocks in the column direction so that the signals $X_1, X_2, \ldots, X_m$ from the X decoder 2 are supplied to each of the second gate electrode connectors 8 in the space between the divided memory blocks by the above described first bypass metal interconnection layer 11 and 12, and the read control signal RD from the CPU 100 is supplied to each of the third gate electrode connectors 9 in the space between the above described memory blocks by the above described second bypass metal interconnection layer 13 and 14. Thus, the interconnection resistance values of the second and third gate electrode connectors 8 and 9 can be decreased without using any extra space. More specifically, in the conventional D-A-ROM shown in FIG. 2, the second and third gate electrode connectors 7, 8 formed of, for example, polysilicon (polycrystalline silicon) couple in series a plurality of gates (not shown) in the memory unit, respectively, so that the interconnection resistances of 1 to 10 Ω with respect to the respective gates are accumulated to be a large interconnection resistance value as a whole, whereby much additional time is required for reading out data. However, in the structure shown in FIG. 3, aluminum interconnections each having a much smaller interconnection resistance value than those of the gate electrode connectors formed of polysilicon, are used to supply signals in parallel to each of the memory blocks. Thus, the interconnection resistance value as a whole is very small. Thus, the time required for reading out data is very short, which is, for example, a fraction of the time in the conventional example. Consequently, the driving ability of a data circuit need not be enhanced, so that the problem of the increase in power consumption is solved. In addition, since the bypass metal interconnections comprise aluminum interconnections of the second layer, an extra space is not used and the integration degree of the circuit is not decreased.

Figure 4:
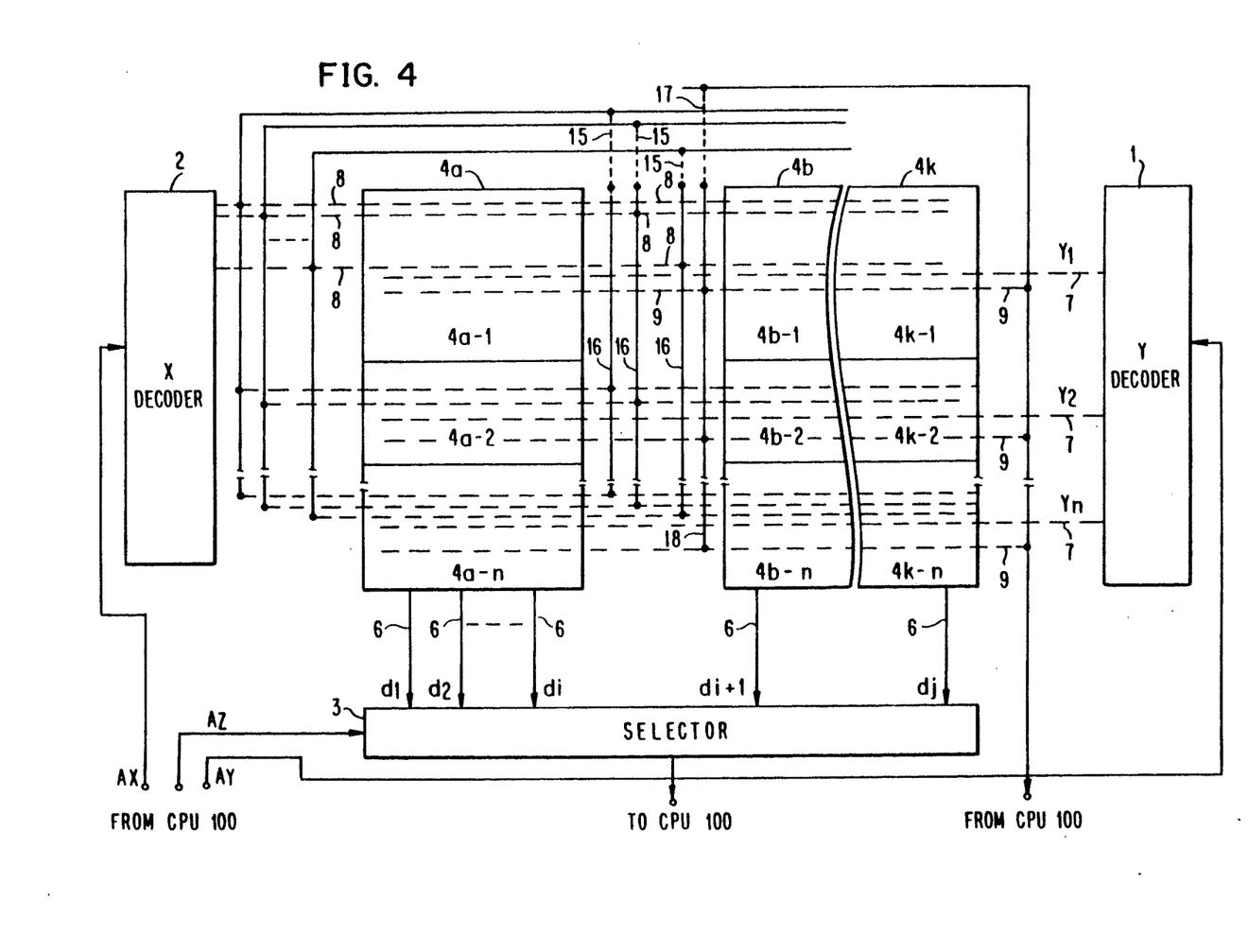
FIG. 4 is a block diagram showing a D-A-ROM according to another embodiment of the present invention.
Figure 5:
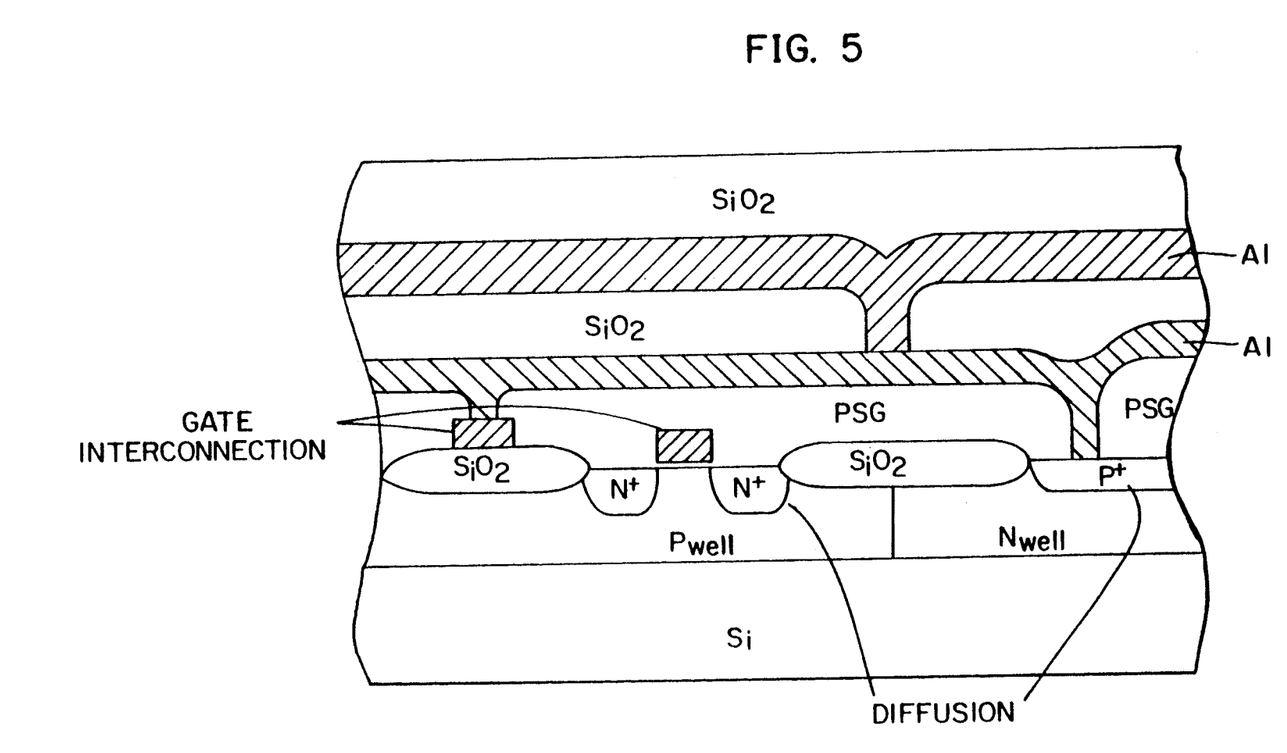
FIG. 5 is a sectional view showing the layers in a chip embodying the invention.

FIG. 4 is a block diagram showing a D-A-ROM according to another embodiment of the present invention. The D-A-ROM shown in FIG. 4 is the same as the D-A-ROM shown in FIG. 3 except for the following. More specifically, aluminum interconnections 15, 16, 17 and 18 of a first layer are formed in place of the aluminum interconnections 11, 12, 13 and 14 of the second layer shown in FIG. 3. The aluminum interconnections 15 and 16 of the first layer, which correspond to the aluminum interconnections 11 and 12 of the second layer shown in FIG. 3, similarly constitute the first bypass metal interconnection layer. The aluminum interconnections 17 and 18 of the first layer, which correspond to the aluminum interconnections 13 and 14 of the second layer shown in FIG. 3, similarly constitute the second bypass metal interconnection layer.

More specifically, the structure of the D-A-ROM shown in FIG. 4 is basically the same as the structure of the D-A-ROM shown in FIG. 3, and the operations thereof are also the same. In the structure shown in FIG. 4, since the aluminum interconnections of the first layer constitute the first and second bypass metal interconnections, a plane space corresponding to the first and second bypass metal interconnection layers is required. However, since the aluminum interconnections each having a low interconnection resistance value is used to supply signals to each of the memory blocks as in FIG. 3, the data reading speed can be significantly improved without increasing the power consumption.

Although in the above described embodiment, as far as the first gate electrode interconnections 11 through 14 which signals $Y_1, Y_2, ..., Y_n$, outputted from a Y decoder 1 are propagated are concerned, the number thereof is small, so that no bypass metal interconnection layer is particularly provided therein, bypass metal interconnections comprising aluminum interconnections of a first or second layer may be provided with regard to the first gate electrode connectors 7, as in the case of second and third gate electrode connectors 8 and 9, in which case data reading can be achieved at higher speed.

Additionally, although in the above described embodiments, description was made on a case in which the present invention is applied to the D-A-ROM, the present invention can be applied to other types of semiconductor memories such as an RAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. In a semiconductor memory, including:
   a memory unit including a plurality of n memory blocks (4 - 1, 4 - 2, . . . , 4 - n) arranged in a column direction, where n is an integer, wherein each block includes a set of corresponding memory rows 1, 2, . . . , m of memory cells, where m is an integer, the improvement wherein:
   each of said memory blocks (4 - 1, 4 - 2, . . . , 4 - n) is divided into k sub-blocks, where k is an integer, arranged in a row direction, thereby providing an array of sub-blocks arranged in n sub-rows and k sub-columns in a two-dimensional manner,
   first row address decoder means for generating first row address signals for selecting from said array of (n×k) memory sub-blocks only memory sub-blocks in a particular sub-row of said memory sub-blocks,
   a plurality of first gate electrode connectors provided for coupling in said row direction a plurality of memory sub-blocks constituting each particular selected sub-row of said array and for applying each of said first row address signals only to the respective plurality of memory sub-blocks constituting each selected sub-row,
   second row address decoder means for generating second row address signals for respectively designating particular memory rows of memory cells in each of said plurality of memory sub-blocks,
   a plurality of second gate electrode connectors provided for coupling in said row direction the plurality of memory sub-blocks including each particular memory row and for applying said second row address signals to the designated memory row in each of the memory sub-blocks including said designated memory row,
   means for supplying a read control signal for defining timing for reading out data,
   a plurality of third gate electrode connectors provided for applying said read control signal to sub-blocks including said designated memory row,
   first bypass metal interconnectors formed above said second gate electrode connectors for applying said second row address signals in parallel from said second row address decoder means to corresponding memory rows in each of said plurality of memory sub-blocks, and
   second bypass metal interconnectors formed above said third gate electrode connectors for applying said read control signal in parallel from said read control signal supplying means to said plurality of memory sub-blocks,
   wherein said first and second bypass metal interconnectors each include a plurality of connectors oriented in a column direction and located in spaces between said memory sub-blocks;
   at least one of said first and second bypass metal interconnectors including a plurality of metal connectors for propagating signals in the column direction.

2. The semiconductor memory according to claim 1, wherein
   said first, second and third gate electrode connectors comprise polycrystalline silicon interconnections, and said first and second bypass metal interconnectors comprise aluminum interconnections.

3. The semiconductor memory according to claim 1, which further comprises
third bypass metal interconnectors formed on said first gate electrode connectors through which respective ones of said second row address signals are applied in parallel to each of said plurality of memory sub-blocks arranged in respective rows of said sub-blocks from said first row address decoder means.

4. The semiconductor memory according to claim 1, which further comprises
third bypass metal interconnectors through which respective ones of said second row address signals are applied in parallel to each of said plurality of memory sub-blocks arranged in respective rows of said sub-blocks from said first row address decoder means.

5. In a semiconductor memory including:
a memory unit including a plurality of n memory blocks (4 - 1, 4 - 2, ..., 4 - n) arranged in a column direction, where n is an integer, wherein each block includes a set of corresponding memory rows 1, 2, ..., m of memory cells, where m is an integer, the improvement wherein:
each of said memory blocks (4 - 1, 4 - 2, ..., 4 - n) is divided into k sub-blocks, where k is an integer, thereby providing an array of sub-blocks arranged in n sub-rows and k sub-columns in a two-dimensional manner,
first row address decoder means for generating first row address signals for selecting from said array of (n×k) memory sub-blocks only memory sub-blocks in a particular sub-row of said memory sub-blocks,
a plurality of first gate electrode connectors provided for coupling in said row direction a plurality of memory sub-blocks constituting each particular selected sub-row of said array and for applying each of said first row address signals only to the respective plurality of memory sub-blocks constituting each selected sub-row,
second row address decoder means for generating second row address signals for respectively designating particular memory rows of memory cells in each of said plurality of memory sub-blocks,
a plurality of second gate electrode connectors provided for coupling in said row direction the plurality of memory sub-blocks including each particular memory row and for applying said second row address signals to the designated memory row in each of the memory sub-blocks including said designated memory row,
means for supplying a read control signal for defining timing for reading out data,
a plurality of third gate electrode connectors provided for applying said read control signal to sub-blocks including said designated memory row,
first bypass metal interconnectors formed above said second gate electrode connectors for applying said second row address signals in parallel from said second row address decoder means to corresponding memory rows in each of said plurality of memory sub-blocks, and
second bypass metal interconnectors formed above said third gate electrode connectors for applying said read control signal in parallel from said read control signal supplying means to said plurality of memory sub-blocks,
at least one of said first and second bypass metal interconnectors including a plurality of metal connectors for propagating signals in the column direction,
wherein said first bypass metal interconnectors comprise:
a plurality of first metal connectors through which said second row address signal is propagated in the row direction, and
a plurality of second metal connectors through which said second row address signal is propagated in the column direction.

6. In a semiconductor memory, including:
a memory unit including a plurality of memory blocks (4 - 1, 4 - 2, ..., 4 - n) arranged in a column direction, where n is an integer, each of said memory blocks (4 - 1, 4 - 2, ..., 4 - n) includes a set of corresponding memory rows 1, 2, ..., m of memory cells, where m is an integer, said memory cells arranged in columns, the improvement wherein:
said memory unit further includes memory cells partitioned into columns, each of said memory blocks being partitioned into k sub-blocks arranged in a row direction, where k is an integer, thereby providing an array of sub-blocks arranged in n sub-rows and k sub-columns in a two-dimensional manner,
first row address decoder means for generating first row address signals for selecting from said array of memory sub-blocks only memory sub-blocks in a particular sub-row p of said memory sub-blocks, where $0 < p < n+1$,
a plurality of first gate electrode connectors provided for coupling in the row direction a plurality of memory sub-blocks constituting each particular selected sub-row of said array and for applying each of said first row address signals only to the respective plurality of memory sub-blocks constituting each selected sub-row,
second row address decoder means for generating second row address signals for respectively designating particular memory rows of memory cells in each of said plurality of memory sub-blocks,
a plurality of second gate electrode connectors provided for coupling in said row direction a plurality of memory sub-blocks including each particular memory row of memory cells and for applying said second row address signals to the designated memory row in each of the memory sub-blocks including said designated memory row of memory cells,
means for supplying a read control signal for defining timing for reading out data,
a plurality of third gate electrode connectors provided for applying said read control signal to sub-blocks including said designated memory row of memory cells,
first bypass metal interconnectors for applying said second row address signals in parallel from said second row address decoder means to corresponding memory rows in each sub-column of said plurality of memory sub-blocks, and
second bypass metal interconnectors for applying said read control signal in parallel from said read control signal supplying means to said plurality of memory sub-blocks, at least one of said first and second bypass metal interconnectors including a plurality of metal connectors oriented in a column direction, wherein said plurality of metal connectors oriented in a column direction are positioned in spaces between adjacent sub-columns of said sub-blocks.

7. The semiconductor memory according to claim 6, wherein said first, second and third gate electrode interconnection layers comprise polycrystalline silicon interconnections, and said first and second bypass metal interconnection layers comprise aluminum interconnections.

8. A semiconductor memory, comprising:

a memory unit including a plurality of memory blocks arranged in a two-dimensional array including rows and columns of said memory blocks, first row address decoder means for generating first row address signals for simultaneously selecting a plurality of blocks in a particular row of said memory blocks, a plurality of first gate electrode connectors (7) provided for each row of said memory blocks for coupling in a row direction a plurality of memory blocks constituting each said row so that each of said first row address signals is applied to a respective row of memory blocks, second row address decoder means for generating second row address signals for designating a specific memory row of memory cells in each row of said memory blocks, a plurality of second gate electrode connectors (8) provided for coupling in said row direction a plurality of said memory blocks including each particular memory row of memory cells so that said second row address signals are each respectively applied to a respective memory row in each of the plurality of rows of memory blocks, means for supplying a read control signal for defining timing for reading out data, a plurality of third gate electrode connectors (9) provided for coupling the plurality of memory blocks constituting each said row of memory blocks so that said read control signal is applied to the memory blocks constituting each said row, a plurality of first bypass metal interconnection connectors (11, 12) formed above said second gate electrode connectors for applying each of said second row address signals in parallel from said second row address decoder means to respective memory rows in each of said memory blocks, and a plurality of second bypass metal interconnection connectors (13, 14) formed above said third gate electrode connectors for applying said read control signal in parallel from said read control signal supplying means to said memory blocks, at least one of said first and second bypass metal interconnection connectors including connectors oriented in a column direction and positioned in spaces between columns of said memory blocks.

9. A semiconductor memory as recited in claim 8 wherein said first and second bypass metal interconnection connectors respectively include connectors (12, 14) oriented in a column direction and positioned in spaces between columns of said memory blocks.

10. In a semiconductor memory, including:

a memory unit including a plurality of n memory blocks (4 - 1, 4 - 2, . . . , 4 - n), where n is an integer, said memory blocks arranged in a column direction, each of said memory blocks (4 - 1, 4 - 2, . . . , 4 - n) includes a set of m corresponding memory rows 1, 2, . . . , m of memory cells, where m is an integer, said memory cells arranged in columns, the improvement wherein:

said memory unit further includes memory cells partitioned into columns, each of said n memory blocks being partitioned into k sub-blocks arranged in a row direction, where k is an integer, thereby providing an array of sub-blocks arranged in n sub-rows and k sub-columns of sub-blocks in a two-dimensional manner, first row address decoder means for generating first row address signals for selecting from said array of memory sub-blocks only memory sub-blocks in a particular sub-row p of said memory sub-blocks, $0<p<n+1$, a plurality of first gate electrode connectors provided for coupling in a row direction a plurality of memory sub-blocks constituting each particular sub-row of said array and for applying each of said first row address signals only to the respective plurality of memory sub-blocks constituting a row corresponding thereto, second row address decoder means for generating second row address signals for respectively designating particular memory rows of memory cells in each of said particular rows of memory sub-blocks, a plurality of second gate electrode connectors provided for coupling in said row direction a plurality of memory cells constituting each particular designated row of memory cells and for applying said second row address signals to the respective designated memory row corresponding thereto in each of the memory sub-blocks, means for supplying a read control signal for defining timing for reading out data, a plurality of third gate electrode connectors provided for applying said read control signal to sub-blocks including said designated memory row of memory cells, first bypass metal interconnectors formed above said second gate electrode connectors and positioned in a column direction, said first bypass metal interconnectors connected for applying said second row address signals in parallel from said second row address decoder means to corresponding memory rows in each sub-column of said plurality of memory sub-blocks, and second bypass metal interconnectors formed above said third gate electrode connectors and positioned in a column direction, said second bypass metal interconnectors connected for applying said read control signal in parallel from said read control signal supplying means to said plurality of memory sub-blocks, wherein said first and second bypass metal interconnectors are positioned between adjacent sub-columns of sub-blocks formed by said partitioned memory blocks.

11. In a semiconductor memory including:

a memory unit including a plurality of n memory blocks (4 - 1, 4 - 2, . . . , 4 - n) arranged in a column direction, where n is an integer, wherein each block includes a set of corresponding memory rows 1, 2, . . . , m of memory cells, where m is an integer, the improvement wherein:

each of said memory blocks is divided into k sub-blocks, where k is an integer, arranged in a row direction, thereby providing an array of sub-blocks arranged in n sub-rows and k sub-columns in a two-dimensional manner, first row address decoder means for generating first row address signals for selecting from said array of (n×k) memory sub-blocks only memory sub-blocks in a particular sub-row of said memory sub-blocks, a plurality of first gate electrode connectors provided for coupling in said row direction a plurality of memory sub-blocks constituting each particular selected sub-row of said array and for applying each of said first row address signals only to the respective plurality of memory sub-blocks constituting each selected sub-row, second row address decoder means for generating second row address signals for respectively designating particular memory rows of memory cells in each of said plurality of memory sub-blocks, a plurality of second gate electrode connectors provided for coupling in said row direction the plurality of memory sub-blocks including each particular memory row and for applying said second row address signals to the designated memory row in each of the memory sub-blocks including said designated memory row, means for supplying a read control signal for defining timing for reading out data, a plurality of third gate electrode connectors provided for applying said read control signal to sub-blocks including said designated memory row, first bypass metal interconnectors formed above said second gate electrode connectors for applying said second row address signals in parallel from said second row address decoder means to corresponding memory rows in each of said plurality of memory sub-blocks, and second bypass metal interconnectors formed above said third gate electrode connectors for applying said read control signal in parallel from said read control signal supplying means to said plurality of memory sub-blocks, at least one of said first and second bypass metal interconnectors including a plurality of metal connectors for propagating signals in the column direction, wherein said plurality of metal connectors for propagating signals in the column direction are positioned between adjacent sub-columns of sub-blocks.

* * * * *